US010638547B2

(12) United States Patent
Sim

(10) Patent No.: US 10,638,547 B2
(45) Date of Patent: Apr. 28, 2020

(54) DIGITAL PCR DEVICE

(71) Applicant: CELL ID PTE LTD, Singapore (SG)

(72) Inventor: Lye Hock Sim, Singapore (SG)

(73) Assignee: CELL ID PTE LTD, Singapore (SG)

( * ) Notice: Subject to any disclaimer, the term of this patent is extended or adjusted under 35 U.S.C. 154(b) by 0 days.

(21) Appl. No.: 15/727,589

(22) Filed: Oct. 7, 2017

(65) Prior Publication Data

US 2018/0035490 A1     Feb. 1, 2018

Related U.S. Application Data

(63) Continuation of application No. PCT/SG2016/050172, filed on Apr. 7, 2016, which is
(Continued)

(51) Int. Cl.
*H05B 3/34*     (2006.01)
*B01L 7/00*     (2006.01)
(Continued)

(52) U.S. Cl.
CPC .............. *H05B 3/34* (2013.01); *B01L 3/505* (2013.01); *B01L 3/50825* (2013.01); *B01L 3/50851* (2013.01); *B01L 3/50855* (2013.01); *B01L 3/502715* (2013.01); *B01L 3/502784* (2013.01); *B01L 7/52* (2013.01); *H05B 3/267* (2013.01);
(Continued)

(58) Field of Classification Search
CPC ....... B01L 2300/0893; B01L 2300/123; B01L 2300/1827; B01L 3/502715; B01L 3/50851; B01L 7/52; B60L 11/1851; B81B 2201/058; B81B 7/0083; H02J 2007/0095; H02J 7/0057; H02J 7/0068;
(Continued)

(56) References Cited

U.S. PATENT DOCUMENTS 6,255,677 B1   7/2001   Caillat et al.
6,533,255 B1   3/2003   Mitsuhashi et al.
(Continued)

FOREIGN PATENT DOCUMENTS

DE   102012219656 A1   4/2014
EP     0890651 A1   1/1999
(Continued)

OTHER PUBLICATIONS

Foreign Communication from a Related Counterpart—International Search Report and Written Opinion, dated Jun. 17, 2016, PCT/SG2016/050172, filed on Apr. 7, 2016.
(Continued)

*Primary Examiner* — Tu B Hoang
*Assistant Examiner* — Diallo I Duniver

(57) ABSTRACT

A digital PCR device comprising: a discrete heating area made of a heat conductive material disposed on a surface that is electrically non-conductive, the discrete heating area comprising a plurality of integral wells configured to contain and partition a DNA sample therein; and at least one conductive trace configured to be connected to a dc voltage source and to heat the plurality of integral wells to a uniform temperature when connected to the dc voltage source, the at least one conductive trace disposed on the surface in an undulating configuration at least partially around the discrete heating area.

18 Claims, 2 Drawing Sheets

Related U.S. Application Data a continuation-in-part of application No. PCT/SG2015/050062, filed on Apr. 7, 2015.

(51) Int. Cl.
*H05B 3/26* (2006.01)
*B01L 3/00* (2006.01)
*B81B 7/00* (2006.01)

(52) U.S. Cl.
CPC ............. *B01J 2219/00495* (2013.01); *B01J 2219/00533* (2013.01); *B01L 2300/0887* (2013.01); *B01L 2300/0893* (2013.01); *B01L 2300/0896* (2013.01); *B01L 2300/123* (2013.01); *B01L 2300/1805* (2013.01); *B01L 2300/1827* (2013.01); *B81B 7/0083* (2013.01); *B81B 2201/058* (2013.01); *H05B 2203/002* (2013.01); *H05B 2203/003* (2013.01)

(58) Field of Classification Search
CPC ........ H05B 2203/002; H05B 2203/003; H05B 3/267; H05B 3/34
USPC ............... 219/549, 385, 521, 428, 427, 435; 422/99, 102
See application file for complete search history.

(56) References Cited

U.S. PATENT DOCUMENTS

| | | | |
|---|---|---|---|
| 7,588,804 | B2 | 9/2009 | Dando |
| 9,999,100 | B2 | 6/2018 | Sim et al. |
| 2002/0079219 | A1 | 6/2002 | Zhao et al. |
| 2002/0150683 | A1* | 10/2002 | Troian ................. B01F 13/0071 137/828 |
| 2002/0183620 | A1 | 12/2002 | Tearney et al. |
| 2002/0192112 | A1 | 12/2002 | Chow |
| 2003/0094953 | A1* | 5/2003 | Brooks ................. B01J 19/0093 324/441 |
| 2003/0183620 | A1 | 10/2003 | Wong |
| 2003/0190265 | A1 | 10/2003 | Anazawa et al. |
| 2005/0028587 | A1 | 2/2005 | Baer et al. |
| 2007/0049869 | A1 | 3/2007 | Park |
| 2007/0111302 | A1* | 5/2007 | Handique ................. B01F 5/061 435/287.2 |
| 2008/0026430 | A1 | 1/2008 | Sarofim et al. |
| 2008/0083740 | A1 | 4/2008 | Kaiserman et al. |
| 2008/0153152 | A1 | 6/2008 | Wakabayashi et al. |
| 2008/0286153 | A1 | 11/2008 | Lee et al. |
| 2009/0082219 | A1* | 3/2009 | Ermantraut ........... B01L 3/5027 506/10 |
| 2009/0186404 | A1 | 7/2009 | Kim et al. |
| 2012/0122721 | A1* | 5/2012 | Fernandez ........... C12Q 1/6825 506/9 |
| 2012/0270225 | A1 | 10/2012 | Wakeley et al. |
| 2014/0162244 | A1 | 6/2014 | Bau et al. |
| 2015/0024477 | A1 | 1/2015 | Mori et al. |
| 2017/0094724 | A1 | 3/2017 | Sim |
| 2018/0035490 | A1 | 2/2018 | Sim et al. |

FOREIGN PATENT DOCUMENTS

| | | | | |
|---|---|---|---|---|
| EP | 1362827 | A1 * | 11/2003 | ........ B01L 3/502707 |
| JP | 5326117 | | 12/1993 | |
| JP | 2002532239 | A | 10/2002 | |
| JP | 2003323219 | A | 11/2003 | |
| JP | 200431147 | | 1/2004 | |
| JP | 2005501712 | A | 1/2005 | |
| JP | 2008151771 | A | 7/2008 | |
| JP | 2013509173 | A | 3/2013 | |
| JP | 201492420 | A | 5/2014 | |
| JP | 2014146478 | A | 8/2014 | |
| WO | WO0224322 | A2 | 3/2002 | |
| WO | 2003022442 | A1 | 3/2003 | |
| WO | 2007099736 | A1 | 9/2007 | |
| WO | WO2009019658 | A2 | 2/2009 | |
| WO | 2011051735 | A2 | 5/2011 | |
| WO | WO 2013044217 | A1 * | 3/2013 | ............ B01L 3/5027 |
| WO | WO2014052590 | A1 | 4/2014 | |
| WO | WO2016163946 | A1 | 10/2016 | |
| WO | WO2016163956 | A1 | 10/2016 | |
| WO | WO2016163957 | A1 | 10/2016 | |

OTHER PUBLICATIONS

Foreign Communication from a Related Counterpart—International Preliminary Report on Patentability, dated Apr. 7, 2017, PCT/SG2016/050172, filed on Apr. 7, 2016.

Foreign Communication From a Related Counterpart Application, International Search Report and Written Opinion dated Jun. 30, 2015, International Application No. PCT/SG2015/050062 filed on Apr. 7, 2015.

Office Action dated Feb. 23, 2017, U.S. Appl. No. 14/893,002, filed Nov. 20, 2015.

Final Office Action dated Jun. 6, 2017, U.S. Appl. No. 14/893,002, filed Nov. 20, 2015.

Advisory Action dated Sep. 27, 2017, U.S. Appl. No. 14/893,002, filed Nov. 20, 2015.

Notice of Allowance dated Oct. 24, 2017, U.S. Appl. No. 14/893,002, filed Nov. 20, 2015.

Foreign Communication From a Related Counterpart Application, European Extended Search Report dated Aug. 12, 2016, European Application No. 15788314.1, National Phase of PCT/SG2015/050062.

Foreign Communication From a Related Counterpart Application, International Search Report and Written Opinion dated Jun. 17, 2016, International Application No. PCT/SG2016/050171 filed on Apr. 7, 2016.

Foreign Communication From a Related Counterpart Application, International Preliminary Report dated Apr. 7, 2017, International Application No. PCT/SG2016/050171 filed on Apr. 7, 2016.

Ohlander, A., et al., "Real-Time Monitoring of Melting Curves on DNA Microarrays in Plastic Lab-On-Foil System Using Silicon Photomultiplier Detectors" 18th International Conference on Minaturized Systems for Chemistry and Life Sciences, Oct. 26, 2014.

Mcdonald, J. Cooper, et al., "Poly(dimethylsiloxane) as a Material for Fabricating Microfluidic Devices," American Chemical Society, Accounts of Chemical Research, vol. 35, No. 7, Jul. 2002.

Restriction Requirement dated Jul. 31, 2019, U.S. Appl. No. 15/727,588, filed Oct. 7, 2017.

Office Action dated Oct. 11, 2019, U.S. Appl. No. 15/727,588, filed Oct. 7, 2017.

Foreign Communication From a Related Counterpart Application, Japanese Office Action dated Feb. 25, 2020, Japanese Application No. 2017-552824 filed on Dec. 4, 2017.

* cited by examiner

DIGITAL PCR DEVICE

CROSS-REFERENCE TO RELATED APPLICATIONS

This application is a continuation of and claims priority to International PCT Application Serial No. PCT/SG2016/050172 filed on Apr. 7, 2016, entitled "DIGITAL PCR DEVICE" which is a continuation-in-part of and claims priority to International PCT Application Serial No. PCT/SG2015/050062 filed on Apr. 7, 2015, entitled, "A DC HEATER," by Lye Hock SIM, both of which are incorporated herein by reference in their entirety for all purposes.

FIELD OF THE INVENTION

This invention relates to a digital PCR (Polymerase Chain Reaction) device.

BACKGROUND OF THE INVENTION

PCR (Polymerase Chain Reaction) is a commonly used method to make multiple copies of a DNA (Deoxyribonucleic Acid) sequence for various applications such as DNA cloning for sequencing, diagnosing disease, identifying individuals from DNA samples, and performing functional analyses of genes. In PCR, replication of the DNA sequence takes place in multiple thermal cycles, with each cycle typically having three main steps: denaturation, annealing and extension. In the denaturation step, a double-stranded DNA template is heated to about 94-98° C. for 20-30 seconds to yield single-stranded DNA. In the annealing step, primers are annealed to the single-stranded DNA by lowering the temperature to about 50-65° C. for 20-40 seconds. In the extension step, using a DNA polymerase (such as Taq), a new double-stranded DNA is synthesized by extending the primer that has been annealed to the single-stranded DNA at an optimum activity temperature of the DNA polymerase (75-80° C. for Taq). In addition to the three main steps mentioned above, an initialization step may be required if the DNA polymerase used is heat activated, and the final extension step of the last cycle may be held for a longer period of time (e.g. 5-15 minutes) to ensure that there are no remaining single-stranded DNA fragments.

Any device for performing PCR needs to be able to perform the repeated thermal cycles in order for the steps of denaturation, annealing and extension to take place. This involves heating and cooling the reaction to the required temperatures and holding the required temperatures for the necessary lengths of time. Given that temperatures go up to nearly and/or more than 100° C., existing microfluidic or lab-on-chip PCR devices typically require an external thermal cycler to supply the necessary heat, thereby limiting their true portability and size during use.

DNA replication via PCR is exponential as the new double-stranded DNA formed in a cycle undergoes denaturation, annealing and extension in the next cycle, such that each cycle effectively doubles the number of DNA sequences obtained. The number of PCR amplification cycles is thus dependent on the number of copies of the DNA at the start of the reaction.

By contrast, digital PCR is a form of PCR where the amount of DNA in the initial sample can be determined without being dependent on the number of PCR cycles so that the starting amount of DNA can be quantified without having to rely on uncertain exponential data. In digital PCR, one DNA sample is partitioned into multiple wells and the PCR is performed simultaneously in all the wells. Concentration of DNA within the multiple wells is assumed to follow a Poisson Distribution. After PCR has been performed, each well will indicate either absence (negative) or presence (positive) of amplified DNA therein. In this way, absolute quantification may be achieved by counting the number of wells that show a positive end result.

Currently, digital PCR systems, like conventional PCR systems, also rely on external thermal cyclers to supply the necessary heat to each of the wells into which the DNA is partitioned, thereby similarly limiting their size and portability. This limits the ability of health care workers in many parts of the world to efficiently perform important infectious disease diagnoses to control epidemics, particularly where the population is spread out over large areas and access to the testing equipment is hampered by poor infrastructure and transport networks.

Recently, a dc heater has been developed that can be heated to up to or more than 100° C. using a voltage of 9 volts or less and wherein the dc heater is one inch square or smaller. The dc heater comprises a discrete heating area made of a heat conductive material disposed on a surface that is electrically non-conductive and at least one conductive trace configured to be connected to a dc voltage source and to heat the discrete heating area to a uniform temperature when connected to the dc voltage source. The at least one conductive trace is disposed in an undulating configuration on the surface at least partially around the discrete heating area. Such a small heater powered by a low voltage source opens up possibilities for many applications in terms of space and power saving, in particular for portable and even disposable use. However, use of such a dc heater for digital PCR is still a challenge due to size constraints in providing a sufficient number of partitions or wells within a small area to contain the DNA sample therein for a meaningful reaction to be carried out when heated by such a small dc heater.

SUMMARY OF INVENTION

According to a first aspect, there is provided a digital PCR device comprising: a discrete heating area made of a heat conductive material disposed on a surface that is electrically non-conductive, the discrete heating area comprising a plurality of integral wells configured to contain and partition a DNA sample therein; and at least one conductive trace configured to be connected to a dc voltage source and to heat the plurality of integral wells to a uniform temperature when connected to the dc voltage source, the at least one conductive trace disposed on the surface in an undulating configuration at least partially around the discrete heating area.

Each of the plurality of integral wells may be defined by well walls comprising a thickness of the discrete heating area.

The plurality of integral wells may be provided as a regular array in the discrete heating area and wherein wells in a same row of the array are in fluid communication with each other via openings in the well walls.

The openings may be collinear along each row of wells.

The digital PCR device may further comprise a top layer provided over the surface, over the discrete heating area comprising the plurality of integral wells, and over the at least one conductive trace.

The surface and the top layer may be formed of at least one flexible sheet material.

BRIEF DESCRIPTION OF FIGURES

In order that the invention may be fully understood and readily put into practical effect there shall now be described by way of non-limitative example only exemplary embodiments of the present invention, the description being with reference to the accompanying illustrative drawings.

DETAILED DESCRIPTION

Figure 1:
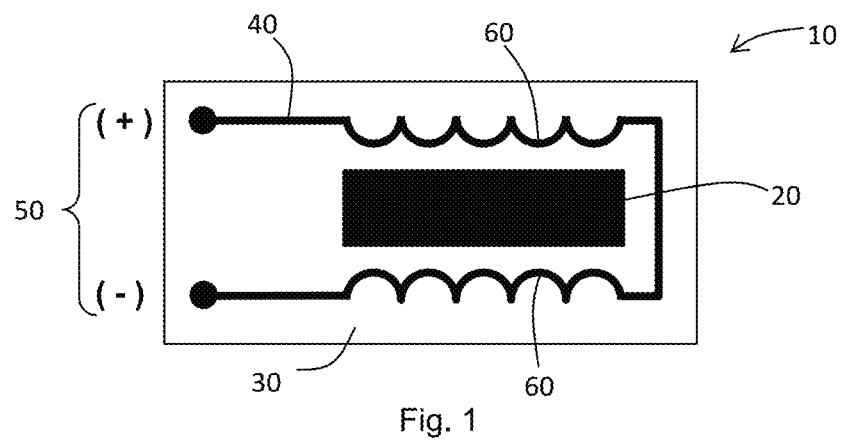
FIG. 1 is a schematic illustration of a first exemplary embodiment of a digital PCR device.

Exemplary embodiments of the digital PCR device 10 and its various applications will be described below with reference to FIGS. 1 to 4, in which the same reference numerals are used to denote the same or similar parts.

In a first embodiment of the digital PCR device 10 as shown in FIG. 1, the digital PCR device 10 comprises a discrete heating area 20 that is made of a biologically inert, heat conductive material disposed on a surface 30 that is electrically non-conductive, such as a polymeric film. The discrete heating area 20 is disposed as a layer of the material having a thickness on the surface 30. The surface 30 may be made of a polymeric material, for example, and may be relatively stiff (e.g., a laminate such as those used for printed circuit boards) or flexible (e.g., a flexible polypropylene sheet, polymeric film, cardstock etc.).

The digital PCR device 10 also comprises a conductive trace 40 configured to be connected to a dc voltage source 50 (indicated as (+) and (−) in FIG. 1) and to heat the discrete heating area 20 to a uniform temperature when connected to the dc voltage source 50. The discrete heating area 20 is not in electrically conductive contact with the conductive trace 40. The conductive trace 40 and discrete heating area 20 are preferably made of the same material, such as gold, which is both conductive and biologically inert.

Figure 2:
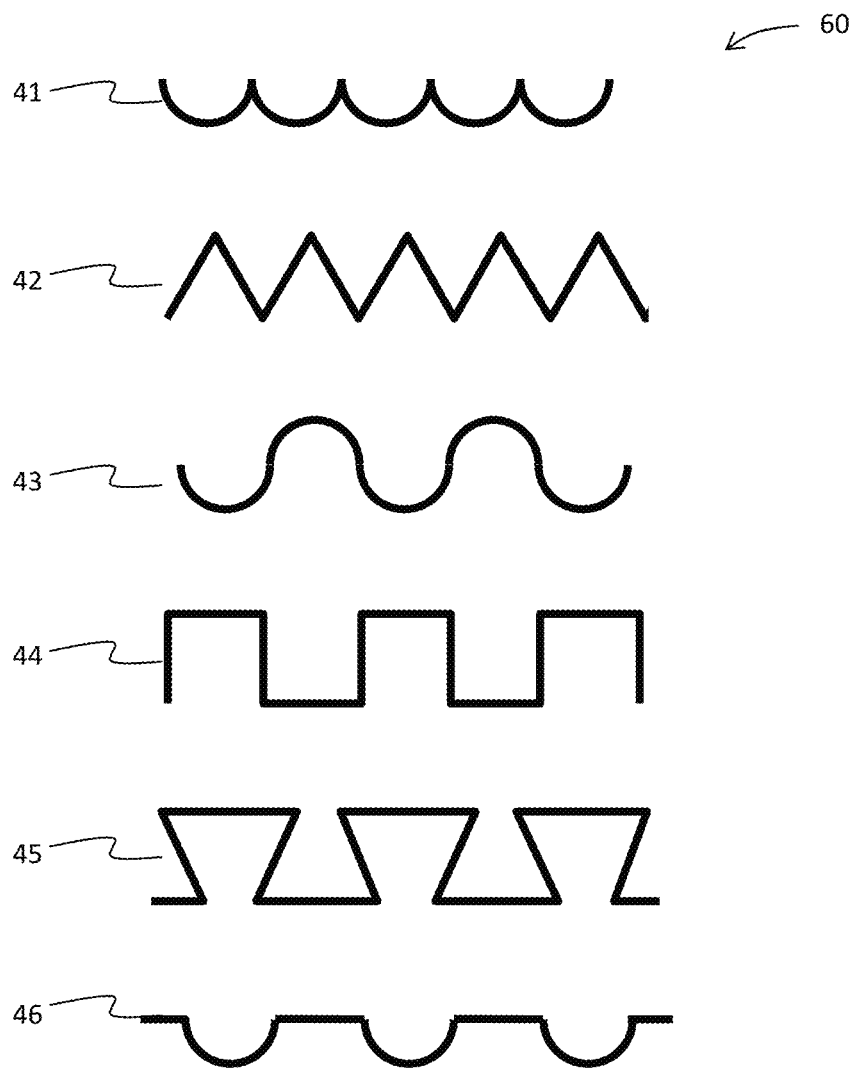
FIG. 2 is a schematic illustration of various embodiments of an undulating configuration of a conductive trace of the digital PCR device.

The conductive trace 40 is disposed in an undulating configuration 60 on the surface 30 at least partially around the discrete heating area 20. In FIG. 1, the undulating configuration 60 has a scalloped 41 form as shown in FIG. 2, comprising a series of circular arcs curving in the same direction, meeting at angles, forming points outward and with the arcs convex towards the discrete heating area 20. In this embodiment, the discrete heating area is rectangular in shape and the undulating configuration 60 is provided on only two opposite sides of the discrete heating area 20.

In alternative embodiments, the undulating configuration 60 may be saw-toothed 42, waved 43, square waved 44, dove-tailed 45, postage stamp edged 46, or a modified form of each of the aforementioned undulating configurations 60, as shown in FIG. 2. The undulating configuration 60 can be considered to comprise repeating units of curves or bends of the conductive trace 40 that may or may not be interspersed with straight portions. It has been found that a higher temperature point occurs at an external or convex edge or corner of wherever the conductive trace 40 curves or bends. Therefore, providing an appropriate undulating configuration 60 of the conductive trace 40 on the surface 30 results in multiple higher temperature points being positioned close to the discrete heating area 20. In this way, sufficient heat can be generated by the undulating configuration 60 of the conductive trace 40 to heat a discrete heating area 20 having dimensions of, for example, only 3 mm by 10 mm to a desired high temperature of, for example, 100° C. or higher, using a dc voltage of only 5 volts as may be provided by a USB port of a laptop, for example.

The dc voltage source 50 may be any suitable power supply having a voltage of 9 volts or less, depending on the application that the digital PCR device 10 is configured for. For example, the dc voltage source 50 may be in the form of batteries, or, as mentioned above, a USB port of a laptop or computer or other host device that has its own power supply and a voltage of 5 volts or less. In this way, the digital PCR device 10 is readily portable as it can be powered with batteries or other portable devices that can supply the low dc voltage used by the digital PCR device 10.

By configuring the discrete heating area 20 to have no electrical contact with any part of the conductive trace 40, it is found that all of the discrete heating area 20 has a uniform temperature when the digital PCR device 10 reaches steady-state heating. This feature of uniform heating is particularly important as the discrete heating area 20 is configured to heat a plurality of integral wells 29 of the digital PCR device 10 into which a DNA sample is partitioned for performing digital PCR, and it is important that all the wells are uniformly heated and none of the wells is exposed to excessive temperatures or temperature spikes that may cause damage to the DNA sample.

Figure 3:
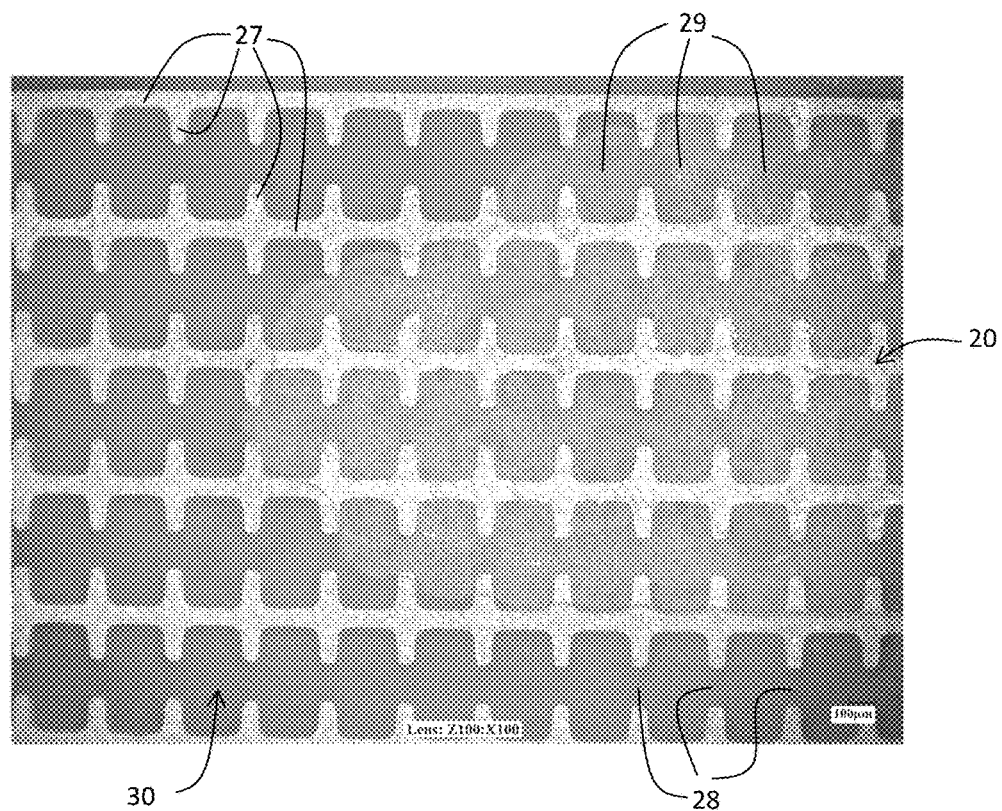
FIG. 3 is a photograph of a plan view of a plurality of integral wells of the digital PCR device.

Notably, the plurality of wells 29 of the digital PCR device 10 are integral with the discrete heating area 20 as shown in FIG. 3. This may be obtained by etching the wells 29 into the discrete heating area 20 or printing the discrete heating area 20 to include the plurality of integral wells 29 or any other suitable method to form the plurality of wells 29 integrally with the discrete heating area 20. In an exemplary embodiment as shown in FIG. 3, each of the plurality of integral wells 29 has internal dimensions of about 420 μm long by 220 μm wide.

Figure 4:
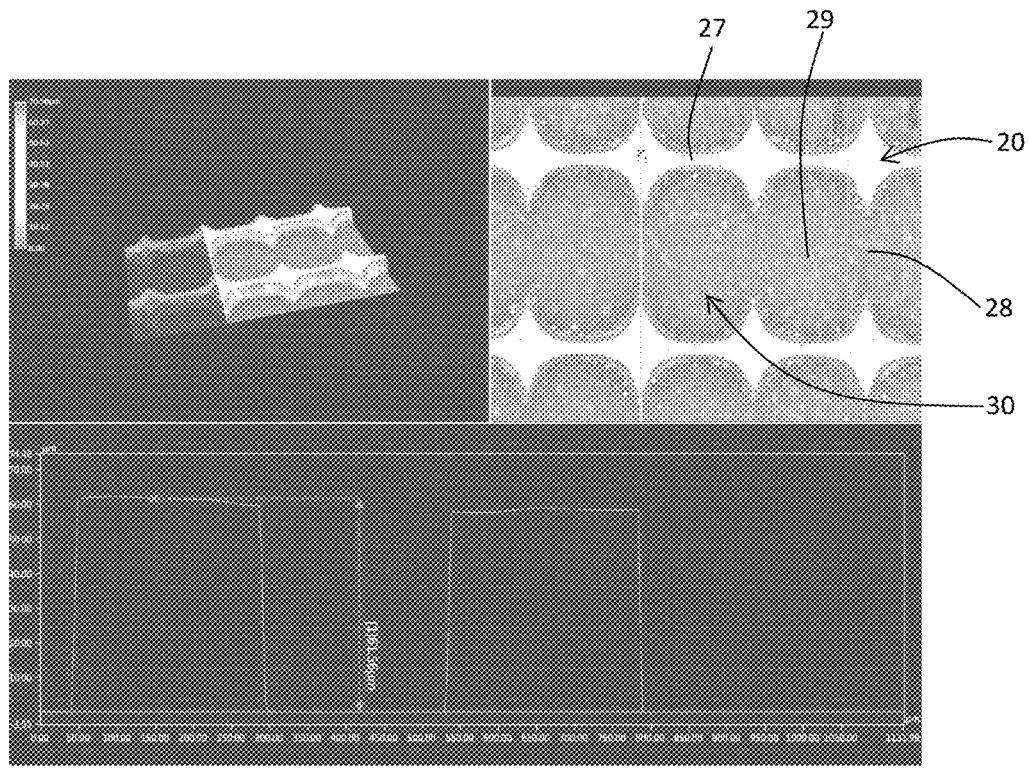
FIG. 4 is a screen capture of dimensions and thermal analysis of a model of a number of wells of the digital PCR device.

Each well 29 is defined by well walls 27 having a wall height of about 60 μm that is the thickness of the discrete heating area 20, as shown in FIG. 4. The plurality of integral wells 29 are preferably provided in a regular array as can be seen in FIG. 3. More preferably, wells 29 in a same row of the array are configured to be in fluid communication with each other via openings 28 in the well walls 27 to allow a DNA sample to be flowed into all the wells 29. In the embodiment shown in FIG. 3, the openings are about 180 μm wide. The openings 28 are preferably collinear along each row of wells to facilitate flow of the DNA sample through the array. In this way, each well 29 is configured to function as a partition to retain a part of the DNA sample that is flowed into the wells 29.

In use, the DNA sample is flowed through the array of the plurality of integral wells 29 such that each well 29 may retain a part of the DNA sample. Appropriate supplying and cycling of the dc voltage to the conductive trace 40 results in the discrete heating area 20 being uniformly heated according to the cycling of the supplied dc voltage so that a same number of cycles of PCR take place in each of the plurality of integral wells 29. Any DNA that is present in each well 29 is amplified a same number of times for all the plurality of integral wells 29. By applying a fluorescent or any other appropriate tag to all the wells 29, wells in which a significant number of DNA was present at the start of the PCR will show a positive result. Counting the wells that show a positive result thus allow the DNA in the sample to be quantified, by adjusting for the number of PCR cycles of amplification in the wells 29.

The digital PCR device 10 preferably has a top layer (not shown) provided over the surface 30, over the discrete heating area 20 and over the conductive trace 40 in order to protect them from damage due to exposure to the environment. The top layer preferably also provides an electrically insulating function for safety of the user. The surface 30 and the top layer may thus enclose the conductive trace 40 and discrete heating area 20 comprising the plurality of integral wells 29 in a package that is less than 3 mm thick.

The top layer should have at least one sample collection opening for placing a DNA sample into the plurality of integral wells 29, and may have one or more other openings for adding reagents into the plurality of integral wells 29. The top layer may also have a transparent portion configured as a result window for viewing the plurality of integral wells 29.

If the digital PCR device 10 is to have its dc voltage source supplied by a USB (Universal Serial Bus) host device, the digital PCR device 10 may additionally be provided with a tab (not shown) where the conductive trace 40 is configured with a USB interface for connection with the USB host device.

In an exemplary embodiment, the digital PCR device 10 comprises a discrete heating area 20 having an area of about 3 mm×10 mm and comprising eight hundred integral wells 29 for performing digital PCR on a 4 μl sample. The ability of the digital PCR device 10 to allow DNA to be quantified from such a small sample is particularly advantageous in forensic applications where only a small DNA sample may be available. The digital PCR device 10 thus provides a readily portable and even disposable solution for various DNA amplification applications for use with a small sample of DNA. It is envisaged that the volume of the sample required by the digital PCR device 10 can go as low as the picolitre range, making possible isothermal amplification or constant temperature PCR cycling. This makes DNA amplifications easier to be performed, which is particularly beneficial for infectious disease diagnoses with the great advantage of being low-cost to enable clinicians to perform diagnoses without having to invest heavily in expensive equipment.

Whilst there has been described in the foregoing description exemplary embodiments of the present invention, it will be understood by those skilled in the technology concerned that many variations in details of design, construction and/or operation may be made without departing from the present invention. For example, alternative configurations of the discrete heating area 20 and undulating configuration 60 can be envisaged to be provided according to the actual application of the digital PCR device as may be required, without limit to the possible shapes and sizes of these features. The number and dimensions of the wells, the wall height, and dimensions of the discrete heating area may all be varied from the examples described above and configured according to a desired number and dimension depending on the specific application and type of PCR to be performed with the device.

The invention claimed is:

1. A digital PCR device comprising:
a discrete heating area made of a biologically inert, heat conductive material disposed as a layer of material having a thickness on a surface of a separate layer that is electrically non-conductive, the discrete heating area comprising a plurality of integrally formed wells configured to contain and partition a DNA sample therein, the plurality of integrally formed wells being formed as openings in the discrete heating area and defined by well walls, such that a height of the well walls comprises the thickness of the discrete heating area; and
at least one conductive trace configured to be connected to a dc voltage source and to heat the discrete heating area to a uniform temperature when connected to the dc voltage source, the at least one conductive trace disposed on the surface in an undulating configuration at least partially surrounding the discrete heating area without being in contact with the discrete heating area, wherein the plurality of integrally formed wells are heated by the discrete heating area via the well walls, and wherein the discrete heating area is not in electrically conductive contact with the conductive trace.

2. The digital PCR device of claim 1, wherein the plurality of integrally formed wells are provided as a regular array in the discrete heating area and wherein wells in a same row of the array are in fluid communication with each other via openings in the well walls.

3. The digital PCR device of claim 2, wherein the openings are collinear along each row of wells.

4. The digital PCR device of claim 1, further comprising a top layer provided over the surface, over the discrete heating area comprising the plurality of integrally formed wells, and over the at least one conductive trace.

5. The digital PCR device of claim 1, wherein the surface and the top layer are formed of at least one flexible sheet material.

6. The digital PCR device of claim 1, wherein the discrete heating area is made of gold.

7. The digital PCR device of claim 1, wherein the surface is formed from a polymeric material.

8. The digital PCR device of claim 1, wherein the at least one conductive trace and the discrete heating area are made of the same material.

9. The digital PCR device of claim 1, wherein the at least one conductive trace is disposed on the surface around the discrete heating area.

10. The digital PCR device of claim 9, wherein the at least one conductive trace comprises one or more points and one or more curves, wherein the one or more curves are positioned towards the discrete heating area, and the one or more points are positioned further away from the discrete heating area.

11. The digital PCR device of claim 1, wherein the dc voltage source is configured to provide 9 volts or less.

12. A digital PCR device comprising:
a film made of a biologically inert, heat conductive material disposed on a surface of a separate layer that is electrically non-conductive, wherein the film comprises a layer of material having a thickness, wherein the film comprises a plurality of integrally formed wells configured to contain and partition a DNA sample therein, the plurality of integrally formed wells being formed by openings in the film and defined by well walls such that a height of the well walls comprises the thickness of the film; and
at least one conductive trace disposed on the surface at least partially surrounding the film without being in contact with the film, wherein the at least one conductive trace is configured to be connected to a dc voltage source and to heat the film to a uniform temperature when connected to the dc voltage source, the at least one conductive trace disposed on the surface in an undulating configuration, wherein the plurality of integrally formed wells are configured to be heated by the at least one conductive trace via the film and the well walls, and wherein the film is not in electrically conductive contact with the conductive trace.

13. The digital PCR device of claim 12, wherein the plurality of integrally formed wells are provided as a regular array in the film, and wherein the wells in a same row of the array are in fluid communication with each other via openings in the well walls.

14. The digital PCR device of claim 13, wherein the openings are collinear along each row of wells.

15. The digital PCR device of claim 12, further comprising a top layer provided over the surface, over the film comprising the plurality of integrally formed wells, and over the at least one conductive trace.

16. The digital PCR device of claim 15, further comprising at least one sample collection opening in the top layer, wherein the at least one sample collection opening is configured to allow a sample to be placed into the plurality of integrally formed wells.

17. The digital PCR device of claim 12, wherein the at least one conductive trace and the film are made of the same material.

18. The digital PCR device of claim 12, wherein the at least one conductive trace is disposed on the surface around the film, and wherein the at least one conductive trace comprises one or more points and one or more curves, wherein the one or more curves are positioned towards the film, and the one or more points are positioned further away from the film.

* * * * *